US011646140B2

(12) United States Patent
Lee et al.

(10) Patent No.: US 11,646,140 B2
(45) Date of Patent: May 9, 2023

(54) MAGNET MODULE AND SPUTTERING APPARATUS INCLUDING THE SAME

(71) Applicant: Samsung Display Co., Ltd., Yongin-Si (KR)

(72) Inventors: Nayoung Lee, Asan-si (KR); Kwanyong Lee, Seoul (KR); Sangmok Nam, Seongnam-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/483,883

(22) Filed: Sep. 24, 2021

(65) Prior Publication Data

US 2022/0148779 A1  May 12, 2022

(30) Foreign Application Priority Data

Nov. 12, 2020  (KR) .................. 10-2020-0151375

(51) Int. Cl.
*H01F 7/02* (2006.01)
*H01J 37/34* (2006.01)

(52) U.S. Cl.
CPC .......... *H01F 7/021* (2013.01); *H01J 37/3408* (2013.01)

(58) Field of Classification Search
CPC .... H01F 7/021; H01F 7/0278; H01J 37/3408; H01J 37/3405; H01J 37/345; C23C 14/35
See application file for complete search history.

(56) References Cited

U.S. PATENT DOCUMENTS 9,218,945 B2 * 12/2015  Chetcuti ............ H01J 37/3405

FOREIGN PATENT DOCUMENTS

| EP | 1566827 A1 * | 8/2005 | ............ C23C 14/35 |
| JP | 2006-016634 A | 1/2006 | |
| JP | 2008-542535 A | 11/2008 | |
| JP | 4551487 B2 * | 9/2010 | ............ C23C 14/35 |
| KR | 10-2001-0002579 A | 1/2001 | |
| KR | 10-0599922 B1 | 7/2006 | |
| KR | 10-2009-0056851 A | 6/2009 | |
| KR | 10-2011-0129279 A | 12/2011 | |
| KR | 10-2012-0015188 A | 2/2012 | |
| KR | 10-2019-0005628 A | 1/2019 | |
| WO | 2006131128 A1 | 12/2006 | |

* cited by examiner

*Primary Examiner* — Mohamad A Musleh
(74) *Attorney, Agent, or Firm* — Innovation Counsel LLP

(57) ABSTRACT

A magnet module includes at least one magnet unit. The magnet unit includes a first magnet member and a second magnet member surrounding the first magnet member in a plan view. The first magnet member extends along a first direction and includes a middle portion and an end portion. The first magnet member includes a first portion, which is disposed in the middle portion and extends along the first direction, and a second portion, which is disposed in the end portion and has a width greater than a width of the first portion.

20 Claims, 14 Drawing Sheets

MAGNET MODULE AND SPUTTERING APPARATUS INCLUDING THE SAME

CROSS-REFERENCE TO RELATED APPLICATION

This application claims priority to and benefits of Korean Patent Application No. 10-2020-0151375 under 35 U.S.C. § 119 filed on Nov. 12, 2020 in the Korean Intellectual Property Office, the entire contents of which are incorporated herein by reference.

BACKGROUND

1. Field

Embodiments relate to a magnet module. More particularly, embodiments relate to a magnet module and a sputtering apparatus including the magnet module.

2. Description of the Related Art

Sputtering is a deposition method that provides a target atom exiting from a target when ions in a plasma collide with the target by an electric energy applied to the ions.

A magnetron-sputtering method may use a magnetic field to increase a deposition rate. For example, a magnetic field formed by a magnet module disposed adjacent to a target may trap ions to generate a highly-dense plasma. Thus, a deposition speed may be increased.

However, a magnetic field may not have uniform distribution, and a plasma may be concentrated on a specific region. Thus, erosion of a target may not be uniform.

SUMMARY

Embodiments provide a magnet module capable of improving irregularity of a magnetic field formed by the magnet module.

Embodiments provide a sputtering apparatus capable of improving irregular erosion of a target.

According to an embodiment, a magnet module includes at least one magnet unit. The magnet unit includes a first magnet member and a second magnet member surrounding the first magnet member in a plan view. The first magnet member extends along a first direction and includes a middle portion and an end portion. The first magnet member includes a first portion, which is disposed in the middle portion and extends along the first direction, and a second portion, which is disposed in the end portion and has a width greater than a width of the first portion. The second magnet member includes a first portion, which is spaced apart from the first magnet member along a second direction crossing the first direction, and a second portion, which is spaced apart from the first magnet member along the first direction. A width of the first magnet member is increased gradually or by steps along the first direction in a portion where Y1 is equal to or greater than L1*0.5 and equal to or less than L1*1.2. A distance between the first magnet member and the second magnet member along the second direction is equal to or greater than L2*0.5 and equal to or less than G1*0.75 at a point where Y1=L1*0.5. Y1 is a distance from the first magnet member to an outer boundary of the second magnet member along the first direction. L1 is a width of the magnet unit along the second direction. L2 is a width of the first portion of the second magnet member. G1 is a distance between the first portion of the first magnet member and the first portion of the second magnet member.

In an embodiment, the first magnet member further includes a third portion that is disposed adjacent to the second portion and has a width decreasing toward the second portion of the second magnet member along the first direction.

In an embodiment, the first magnet member further includes a fourth portion that is disposed between the first portion and the second portion and has a width less than a width of the second portion and greater than a width of the first portion.

In an embodiment, the width of the fourth portion is reduced gradually from the second portion toward the first portion, in the first magnet member.

In an embodiment, the width of at least a portion of the third portion of the first magnet member is greater than the width of the second portion of the first magnet member.

In an embodiment, the first magnet member further includes a third portion that is disposed closer to the second magnet member than the second portion is and has a uniform width greater than the width of the second portion of the first magnet member.

In an embodiment, the second magnet member further includes a corner portion that connects the first portion and the second portion of the second magnet member to each other and has a boundary surface extending in an inclined direction crossing the first direction and the second direction.

In an embodiment, a plurality of magnet units are arranged along the second direction. Center lines of the first magnet member and the second magnet member which extend along the first direction, coincide with each other in a magnet unit disposed in an inner area of the magnet module. A virtual center line of the first magnet member disposed outmost portion of the magnet module does not overlap a virtual center line of the second magnet member disposed outmost portion of the magnet module In an embodiment, a height of the first magnet member is different from a height of the second magnet member.

In an embodiment, the first magnet member is an S-pole, and the second magnet member is an N-pole.

In an embodiment, the first magnet member is an N-pole, and the second magnet member is an S-pole.

In an embodiment, the magnet module further includes a shielding member partially covering the magnet unit.

According to an embodiment, a magnet module includes at least one magnet unit. The magnet unit includes a first magnet member and a second magnet member surrounding the first magnet member in a plan view. The first magnet member extends along a first direction and includes a middle portion and an end portion. The first magnet member includes a first portion, which is disposed in the middle portion and extends along the first direction, a second portion which is disposed in the end portion and has a width greater than a width of the first portion, and a third portion that is disposed adjacent to the second portion and has a width decreasing toward the second magnet member along the first direction. The second magnet member includes a first portion which extends along the first direction and is spaced apart from the first magnet member along a second direction crossing the first direction and a second portion which is spaced apart from the first magnet member along the first direction.

According to an embodiment, a sputtering apparatus includes a back plate connected to a power supplier and a magnet module disposed under the back plate. The magnet module includes at least one magnet unit. The magnet unit includes a first magnet member and a second magnet member surrounding the first magnet member in a plan view. The first magnet member extends along a first direction and includes a middle portion and an end portion. The first magnet member includes a first portion which is disposed in the middle portion and extends along the first direction and a second portion which is disposed in the end region and has a width greater than a width of the first portion. The second magnet member includes a first portion, which is spaced apart from the first magnet member along a second direction crossing the first direction, and a second portion, which is spaced apart from the first magnet member along the first direction. A width of the first magnet member is increased gradually or by steps along the first direction in a portion where Y1 is equal to or greater than L1*0.5 and equal to or less than L1*1.2. A distance between the first magnet member and the second magnet member along the second direction is equal to or greater than L2*0.5 and equal to or less than G1*0.75 at a point where Y1=L1*0.5. Y1 is a distance from the first magnet member to an outer boundary of the second magnet member along the first direction. L1 is a width of the magnet unit along the second direction. L2 is a width of the first portion of the second magnet member. G1 is a distance between the first portion of the first magnet member and the first portion of the second magnet member.

According to embodiments, uniformity of magnetic field in a sputtering apparatus may be improved. Thus, erosion uniformity of a target may be improved. Thus, quality of a thin film formed by sputtering may be improved, and a target may be used for a longer time.

BRIEF DESCRIPTION OF THE DRAWINGS

Aspects of one or more embodiments of the present inventive concept will be more clearly understood from the following detailed description taken in conjunction with the accompanying drawings.

DETAILED DESCRIPTION

Magnet modules and sputtering apparatuses according to embodiments of the present inventive concept will be described hereinafter with reference to the accompanying drawings in which some embodiments are shown.

Figure 1:
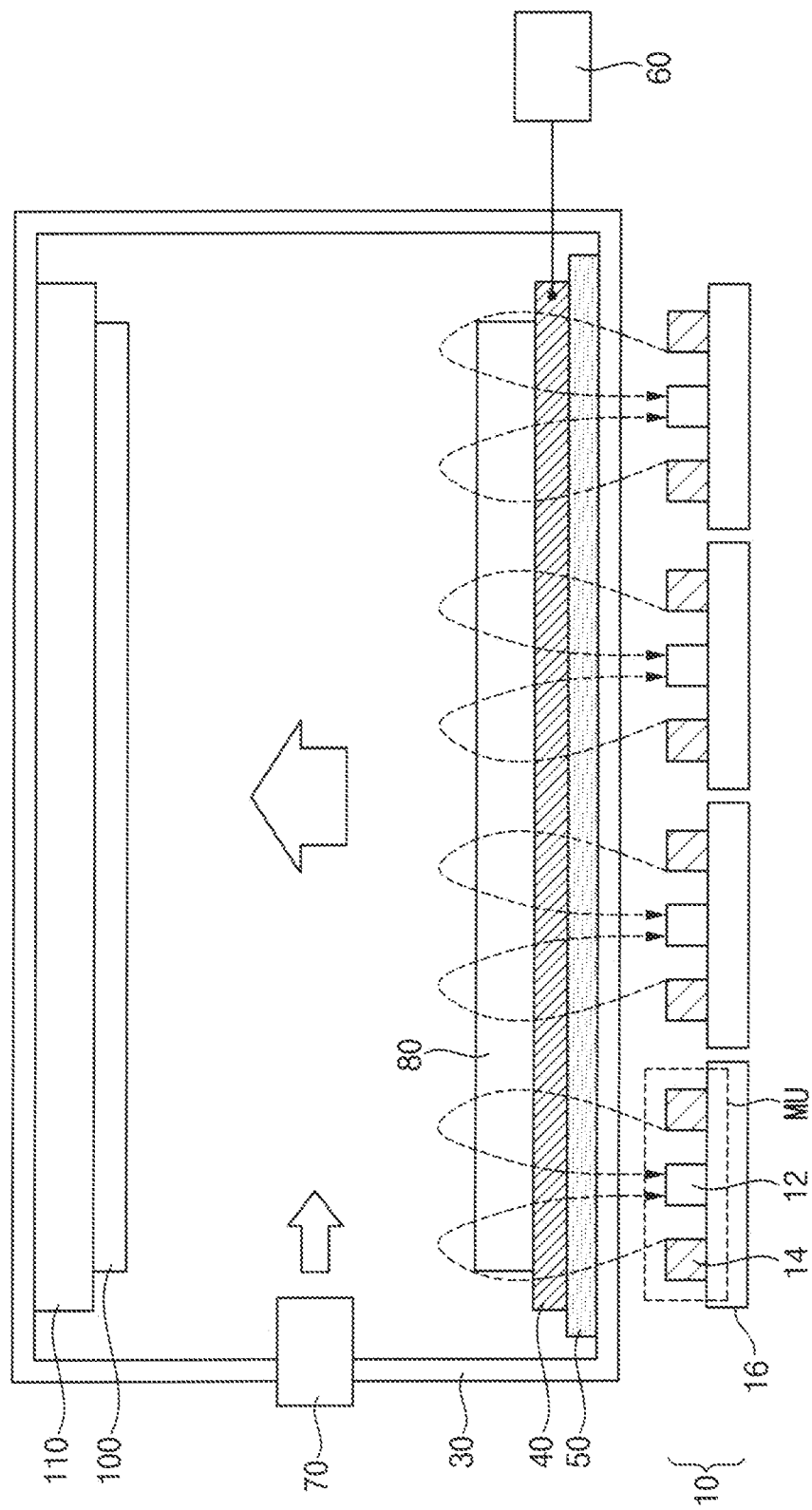
FIG. 1 is a schematic view illustrating a sputtering apparatus according to an embodiment.

FIG. 1 is a schematic view illustrating a sputtering apparatus according to an embodiment.

Referring to FIG. 1, a sputtering apparatus according to an embodiment includes a back plate 40 and a magnet module 10 disposed under the back plate 40. The back plate 40 may support a target 80 and may function as an electrode (cathode) which receives a voltage to generate plasma.

The sputtering apparatus may further include a chamber 30 which receives an inert gas to generate plasma and to provide a discharging space for the plasma. The inert gas may be provided into the chamber 30 through a gas supply part 70. For example, the inert gas may include argon (Ar), neon (Ne), xenon (Xe) or the like.

A deposition substrate 100 may be disposed in the chamber 30. The deposition substrate 100 may be spaced apart from the target 80 and may face the target 80. For example, the deposition substrate 100 may be fixed in the chamber 30 by a substrate-fixing part 110.

The back plate 40 may be electrically connected to a power supplier 60. The power supplier 60 may provide a radio frequency (RF) power (alternating current power) or a direct current (DC) power to the back plate 40.

When a voltage is applied to the back plate 40, plasma discharge may take place in the chamber 30 and an inert gas may be ionized. The ionized atoms may be accelerated toward to the target 80 to collide with the target 80. Then, atoms constituting the target 80 may ejected or sputtered therefrom and may travel toward the deposition substrate 100 so that a thin film may be formed on the deposition substrate 100.

The target 80 may include various materials depending on a thin film to be deposited on the deposition substrate 100. For example, the target 80 may include a metal, a metal oxide or a combination thereof. For example, the metal may include aluminum, titanium, molybdenum, gold, silver, indium, zinc, tin, silicon or a combination thereof. For example, the metal oxide may include indium oxide, zinc oxide, tin oxide, indium zinc oxide, indium zinc oxide, indium zinc tin oxide, indium zinc gallium oxide or a combination thereof.

The magnet module 10 may form a magnetic field to increase a plasma density and a deposition rate when plasma is generated.

In an embodiment, a protective sheet 50 may be disposed between the back plate 40 and the magnet module 10. For example, the protective sheet 50 may include a fluorine-containing resin such as polytetrafluoro ethylene (PTFE) or the like.

The magnet module 10 may be combined with the back plate 40 to constitute a cathode module. For example, the cathode module may be disposed in the chamber 30, or may be inserted into the chamber 30 so that a portion of the cathode module may be disposed in the chamber 30. However, embodiments are not limited thereto, and the magnet module 10 and the back plate 40 may be combined to each other according to various configurations known in the art.

Figure 2:
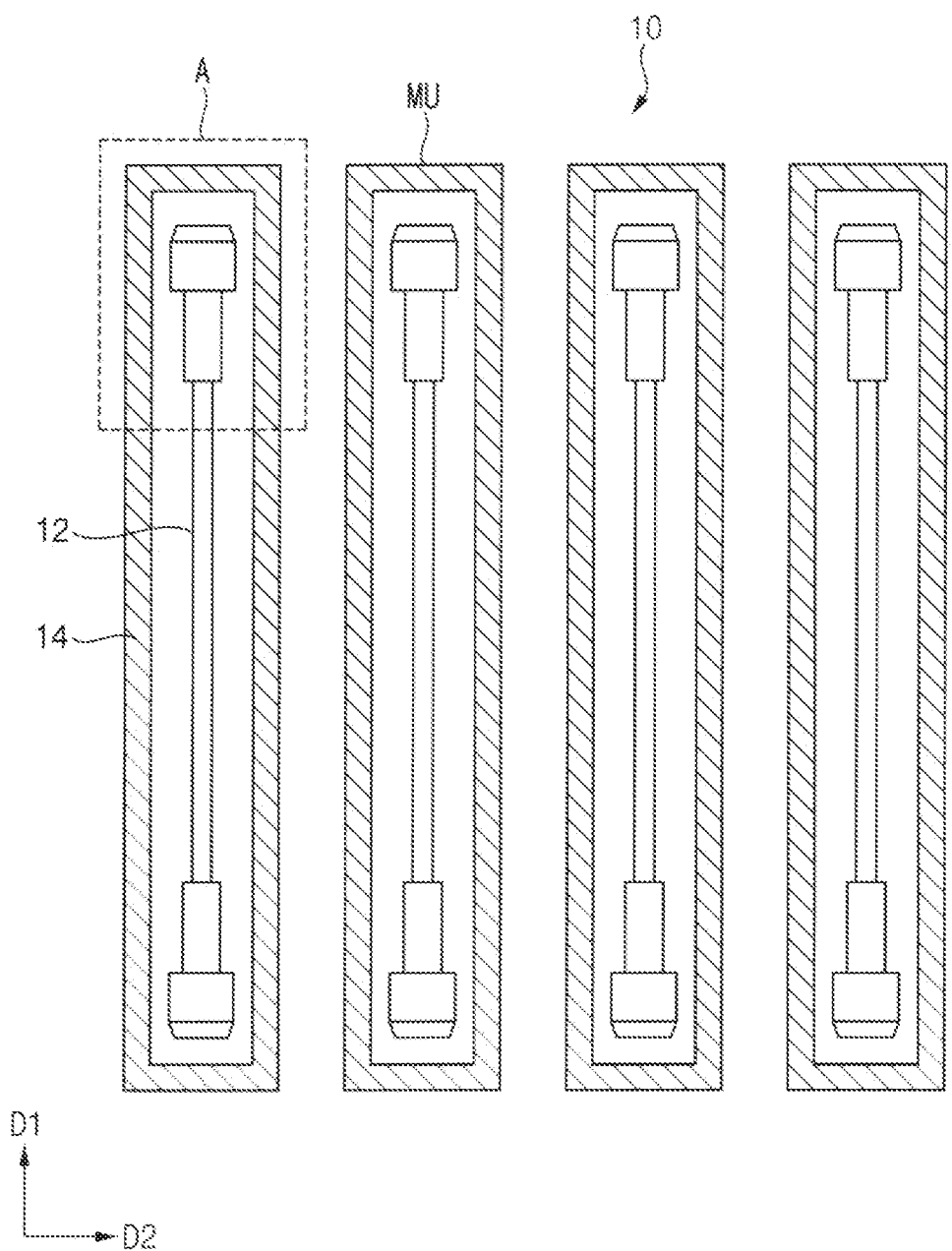
FIG. 2 is a plan view illustrating a magnet module according to an embodiment.

FIG. 2 is a plan view illustrating a magnet module according to an embodiment.

Referring to FIGS. 1 and 2, a magnet module 10 includes a plurality of magnet unit MU each of which includes a first magnet member 12 and a second magnet member 14. The first magnet member 12 may extend along a first direction D1. The second magnet member 14 may surround the first magnet member 12 in a plan view. The second magnet member 14 may completely surround the first magnet member 12 in a plan view. The first magnet member 12 and the second magnet member 14 may be fixed on a supporting plate 16 to form the magnet unit MU.

The first magnet member 12 and the second magnet member 14 may have poles opposite to each other. For example, the first magnet member 12 may have an S-pole and the second magnet member 14 may have an N-pole. However, embodiments are not limited thereto, and the first magnet member 12 may have an N-pole and the second magnet member 14 may have an S-pole.

In an embodiment, a height of the first magnet member 12 (a height of an upper surface) may be substantially the same as a height of the second magnet member 14. However, embodiments are not limited thereto. For example, the first magnet member 12 and the second magnet member 14 may have different heights from each other.

A magnet unit MU may include one first magnet member 12 and one second magnet member 14. A plurality of magnet units may be arranged along a second direction D2 crossing the first direction D1 to form the magnet module 10.

In an embodiment, the first magnet member 12 may have a width in an end portion (distal region) greater than in a middle portion. Particular shapes of the first magnet member 12 and the second magnet member 14 will be explained more fully hereinafter.

Figure 3:
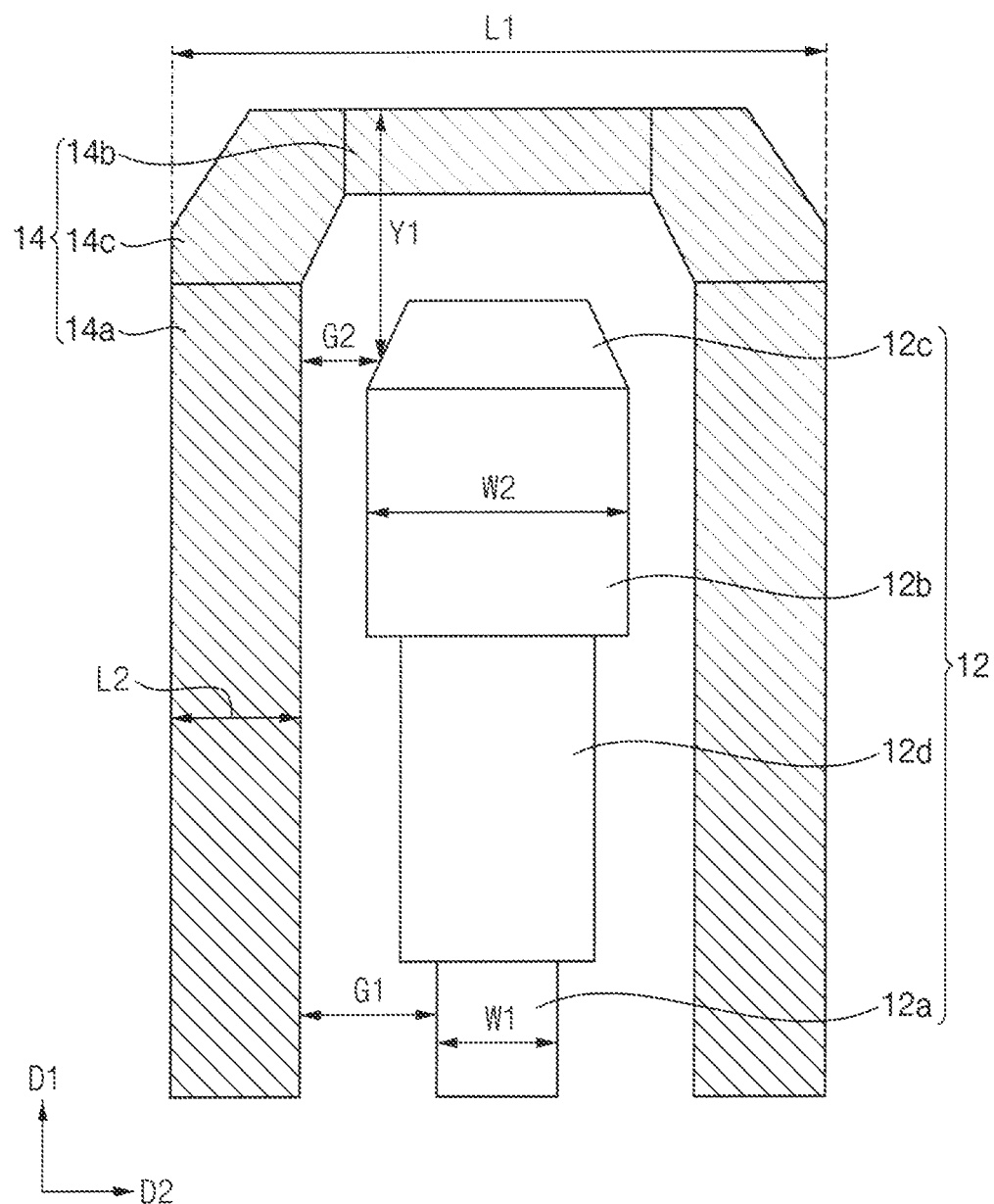
FIG. 3 is an enlarged plan view illustrating region 'A' of FIG. 2.

FIG. 3 is an enlarged plan view illustrating region 'A' of FIG. 2.

Referring to FIG. 3, the first magnet member 12 includes a first portion 12a which extends along the first direction D1, and a second portion 12b which has a width greater than a width of the first portion 12a and extends along the first direction D1. The second portion 12b may be spaced apart from or adjacent to the first portion 12a along the first direction D1. For example, the second portion 12b may have a substantially rectangular shape in a plan view.

The first magnet member 12 includes a third portion 12c adjacent to the second portion 12b. A width (average width) of the third portion 12c may be less than the width of the second portion 12b. For example, the third portion 12c may be disposed adjacent to the second portion 12b along the first direction D1 and forms a distal end of the first magnet member 12. The width of the third portion 12c may be reduced in a direction away from the second portion 12b. For example, the third portion 12c adjacent to the second portion 12B may have the greatest width which is the same width W2 as the second portion 12B and the width of the third portion 12C decreases from the third portion 12c adjacent to the second portion 12B to the end of the third portion 12c.

In an embodiment, the third portion 12c may have a tapered shape having a gradually decreasing width. However, embodiments are not limited thereto. For example, the third portion 12c may have a width decreasing step wise.

A fourth portion 12d may be disposed between the second portion 12b and the first portion 12a. A width of the fourth portion 12d may be greater than the width W1 of the first portion 12a and less than the width W2 of the second portion 12b. The fourth portion 12d may reduce a large width change between the first portion 12a and the second portion 12b so that change of magnetic field at a boundary area between the first portion 12a and the second portion 12b may be reduced.

For example, the first portion 12a of the first magnet member 12 may be referred to as a middle portion or a middle region. The second portion 12b, the third portion 12c and the fourth portion of the first magnet member 12 may be referred to as an end portion or an end region.

The second magnet member 14 may include a first portion 14a which is spaced apart from the first magnet member 12 along the second direction D2 and a second portion 14b which is spaced apart from the first magnet member along the first direction D1. For example, the first portion 14a may extend along the first direction D1 and the second portion 14b may extend along the second direction D2. In an embodiment, the second portion 14b of the second magnet member 14 may be disposed adjacent to the third portion 12c of the first magnet member 12 to face an end of the third portion 12c.

In an embodiment, the second magnet member 14 may include a corner portion 14c that connects the first portion 14a to the second portion 14b. In an embodiment, the corner portion 14c may extends in an inclined direction to cross the first direction D1 and the second direction D2. Thus, decrease of magnetic field in an area adjacent to the corner portion 14c may be improved.

In an embodiment, the first magnet member 12 may be designed according to the following conditions.

(1) In a portion where Y1 is equal to or greater than L1*0.5 and equal to or less than L1*1.2, a width of the first magnet member 12 increase gradually or step wise toward the distal end of the first magnet member 12.

(2) At a point where Y1=L1*0.5, G2 is equal to or greater than L2*0.5 and equal to or less than G1*0.75.

Y1 is a distance from the first magnet member to an outer boundary of the second magnet member along the first direction.

L1 is a width of the magnet unit along the second direction (an entire width of the second magnet member).

L2 is a width of the first portion of the second magnet member.

G1 is a distance between the first portion of the first magnet member and the first portion of the second magnet member.

G2 is a distance between the first magnet member and the second magnet member along the second direction.

When G2 is less than L2*0.5, magnetic field may be distorted, and the magnet members may be damaged. When G2 is greater than G1*0.75, uniformity of magnetic field may be bad.

In an embodiment having the shape illustrated in FIG. 3, L1 may be about 120 mm, L2 may be about 17 mm, G1 may be about 31 mm, the distance along the first direction D1 between the third portion 12c of the first magnet member 12 and the second portion 14b of the second magnet member 14 may be 22 mm, the minimum of Y1 may be about 39 mm, the width of the first portion 12a of the first magnet member 12 may be about 24 mm, the width of the second portion 12b of the first magnet member 12 may be about 40 mm, the minimum width of the third portion 12c of the first magnet member 12 may be about 30 mm, the width of the fourth portion 12d of the first magnet member 12 may be about 30 mm, the length of the second portion 12b of the first magnet member 12 may be about 52 mm, the length of the third portion 12c of the first magnet member 12 may be about 9 mm, the length of the fourth portion 12d of the first magnet member 12 may be about 50 mm, G2 for the second portion 12b of the first magnet member 12 may be about 23 mm, and G2 for the fourth portion 12d of the first magnet member 12 may be about 28 mm. In the above, the length is defined along the first direction D1, and the width is defined along the second direction D2.

Figure 4:
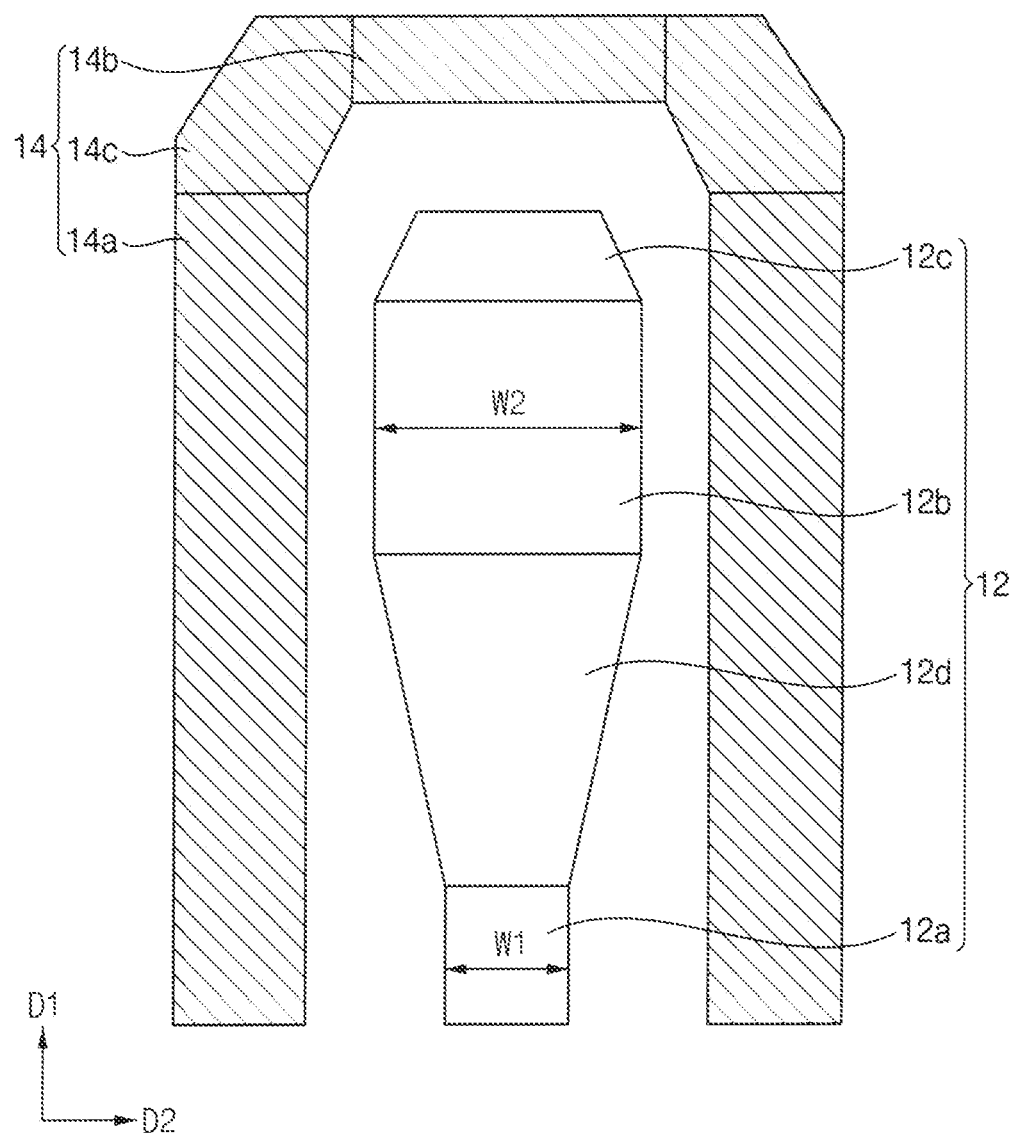
FIGS. 4, 5 and 6 are enlarged plan views illustrating a portion of a magnet module according to embodiments.
Figure 5:
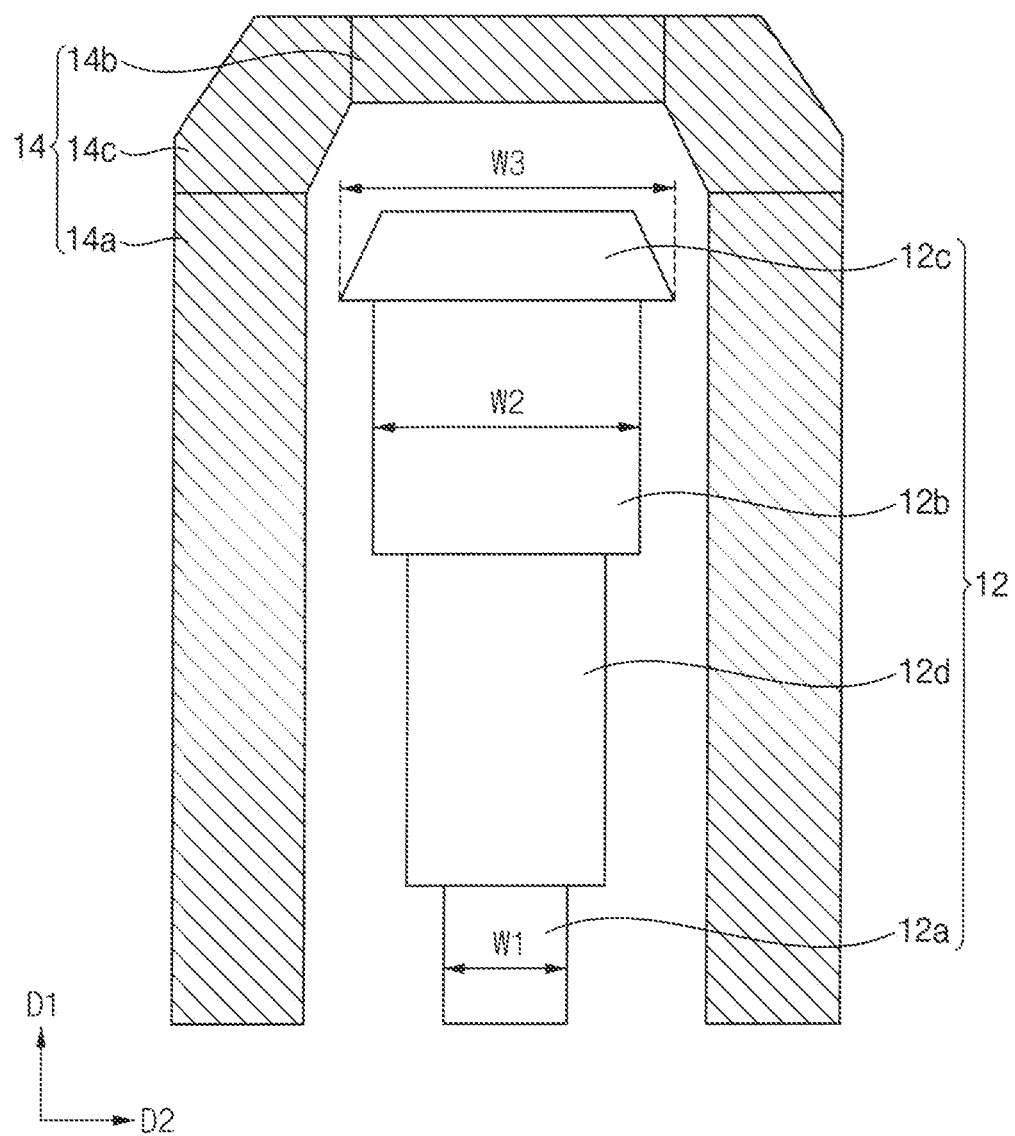
Figure 6:
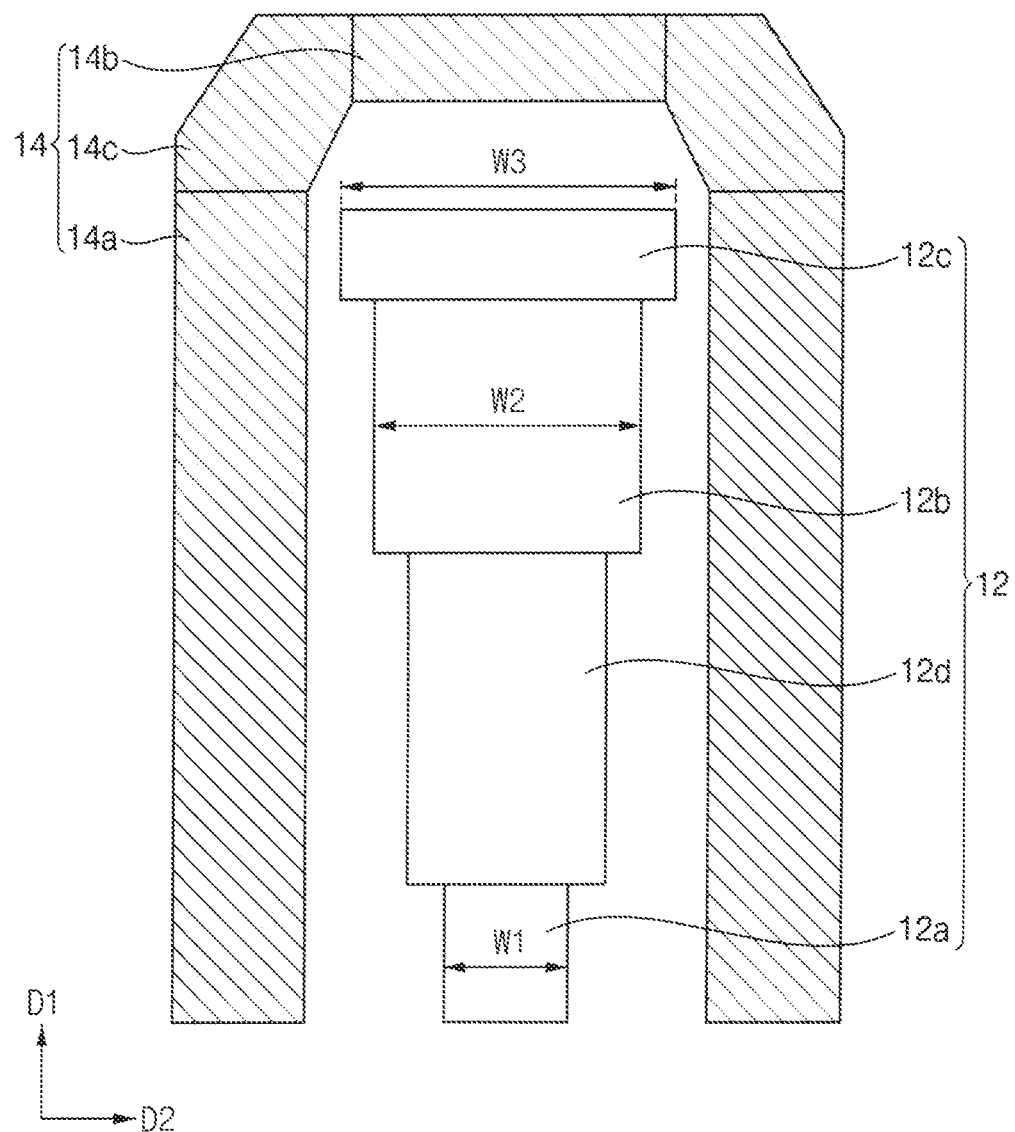

FIGS. 4, 5 and 6 are enlarged plan views illustrating a portion of a magnet module according to embodiments.

Referring to FIG. 4, a first magnet member 12 includes a first portion 12a which has a width W1 and extends along a first direction D1, a second portion 12b which has a width W2 greater than a width W1 of the first portion 12a, a third portion 12c which is disposed between the second portion 12b and a second magnet member 14, and a fourth portion 12d which is disposed between the second portion 12b and the first portion 12a. The first portion 12a may be disposed in a middle portion of the first magnet member 12. The second portion 12b, the third portion 12c and the fourth portion 12d may be disposed in an end portion of the first magnet member 12.

The second magnet member 14 includes a first portion 14a which is spaced apart from the first magnet member 12 along the second direction D2, a second portion 14b which is spaced apart from the first magnet member 12 along the first direction D1, and a corner portion 14c which connects the first portion 14a to the second portion 14b.

In an embodiment, a width of the third portion 12c of the first magnet member 12 may be less than the width W2 of the second portion 12b. For example, the third portion 12c may have a shape with a width decreasing in a direction away from the second portion 12b. A width of the fourth portion 12d of the first magnet member 12 may be gradually reduced in a direction close to the first portion 12a.

In an embodiment, the first magnet member 12 may have seamless edges so that uniformity of magnetic field may be further improved.

Referring to FIG. 5, a first magnet member 12 includes a first portion 12a which has a width W1 and extends along a first direction D1, a second portion 12b which has a width W2 greater than a width W1 of the first portion 12a, a third portion 12c which is disposed between the second portion 12b and a second magnet member 14, and a fourth portion 12d which is disposed between the second portion 12b and the first portion 12a. The first portion 12a may be disposed in a middle portion of the first magnet member 12. The second portion 12b, the third portion 12c and the fourth portion 12d may be disposed in an end portion of the first magnet member 12.

The second magnet member 14 includes a first portion 14a which is spaced apart from the first magnet member 12 along the second direction D2, a second portion 14b which is spaced apart from the first magnet member 12 along the first direction D1, and a corner portion 14c which connects the first portion 14a to the second portion 14b.

In an embodiment, a width of at least a portion of the third portion 12c of the first magnet member 12 may be greater than a width W2 of the second portion 12b. For example, the third portion 12c may have a width W3 greater than a width W2 of the second portion 12b in an area adjacent to the second portion 12b and may have a shape with a width decreasing gradually in a direction away from the second portion 12b.

Referring to FIG. 6, a first magnet member 12 includes a first portion 12a which has a first width W1 and extends along a first direction D1, a second portion 12b which has a width W2 greater than a width W1 of the first portion 12a, a third portion 12c which is disposed between the second portion 12b and a second magnet member 14, and a fourth portion 12d which is disposed between the second portion 12b and the first portion 12a. The first portion 12a may be disposed in a middle portion of the first magnet member 12. The second portion 12b, the third portion 12c and the fourth portion 12d may be disposed in an end portion of the first magnet member 12.

The second magnet member 14 includes a first portion 14a which is spaced apart from the first magnet member 12 along the second direction D2, a second portion 14b which is spaced apart from the first magnet member 12 along the first direction D1, and a corner portion 14c which connects the first portion 14a to the second portion 14b.

In an embodiment, a width of the third portion 12c of the first magnet member 12 may have a uniform width W3 which is greater than a width W2 of the second portion 12b. For example, the third portion 12c may have a substantially rectangular shape.

Figure 7:
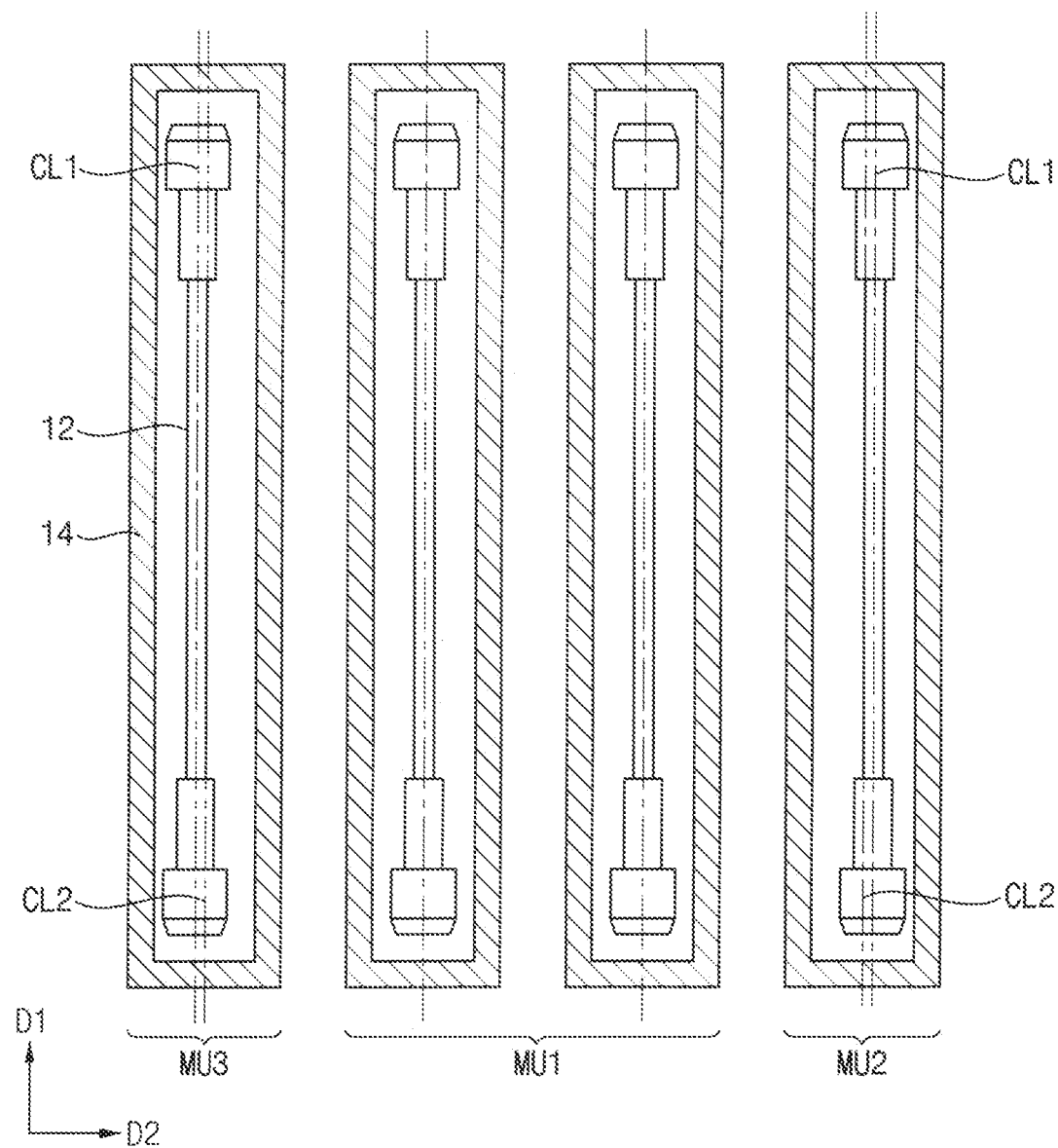
FIG. 7 is a plan view illustrating a magnet module according to an embodiment.

FIG. 7 is a plan view illustrating a magnet module according to an embodiment.

Referring to FIGS. 1 and 7, a magnet module includes a plurality of magnet units MU. Each of the magnet units MU includes a first magnet member 12 and a second magnet member 14. The first magnet member 12 may extend along a first direction D1. The second magnet member 14 may surround the first magnet member 12 in a plan view. The second magnet member 14 may completely surround the first magnet member 12 in a plan view. The first magnet member 12 and the second magnet member 14 may be fixed on a supporting plate 16.

In an embodiment, the first magnet member 12 may have a width in an end portion greater than that in a middle portion. Shapes of the first magnet member 12 and the second magnet member 14 may be substantially same as those explained in the above.

A magnet unit MU may be defined by a combination of one first magnet member 12 and one second magnet member 14. A plurality of magnet units may be arranged along a second direction D2 crossing the first direction D1.

In an embodiment, the magnet module 10 may include an inner area and an outer area adjacent to the inner area along the second direction D2. The magnet module may include a first magnet unit MU1 which is disposed in the inner area, and a second magnet unit MU2 which is disposed in the outer area. The magnet module may further include a third magnet unit MU3 disposed in another outer area opposite to the second magnet unit MU2.

In the first magnet unit MU1, the first magnet member 12 may be disposed to be symmetrical with respect to a virtual center line passing through a center portion of the second magnet member 14 along the first direction D1. For example, the virtual center line passing through the center portion of the second magnet member 14 along the first direction D1 may be coincide with a virtual center line passing through a center portion of the first magnet member 12 along the first direction D1.

In the second magnet unit MU2 and the third magnet unit MU3, the first magnet member 12 may be disposed to be asymmetrical with respect to a virtual center line CL2 passing through a center portion of the second magnet member 14 along the first direction D1. For example, a virtual center line CL1 passing through a center portion of the first magnet member 12 along the first direction D1 may be spaced apart from the virtual center line CL2 passing through a center portion of the second magnet member 14 along the first direction D1. The virtual center line CL1 passing through the center portion of the first magnet member 12 along the first direction D1 is disposed outside of the virtual center line CL2 passing through the center portion of the second magnet member 14 along the first direction D1 in the second magnet unit MU2. The virtual center line CL1 passing through the center portion of the first magnet member 12 along the first direction D1 is disposed outside of the virtual center line CL2 passing through the center portion of the second magnet member 14 along a direction opposite to the second direction D2 in the third magnet unit MU3. In other words, the virtual center lines of the first magnet member 12 disposed outmost portions of the magnet module 10 is not disposed to overlap the virtual center line of the second magnet member 14 but is shifted to outside of the virtual center line of the second magnet member 14.

In an embodiment, a shifted amount, which may be a distance between the virtual center lines CL1 and CL2, may be about 5 mm to 10 mm. When the shifted amount is excessively large, the first magnet member 12 and the second magnet member 14 may contact each other.

According to the above configuration, uniformity of magnetic field may be improved in the outer area of the magnet module.

Figure 8:
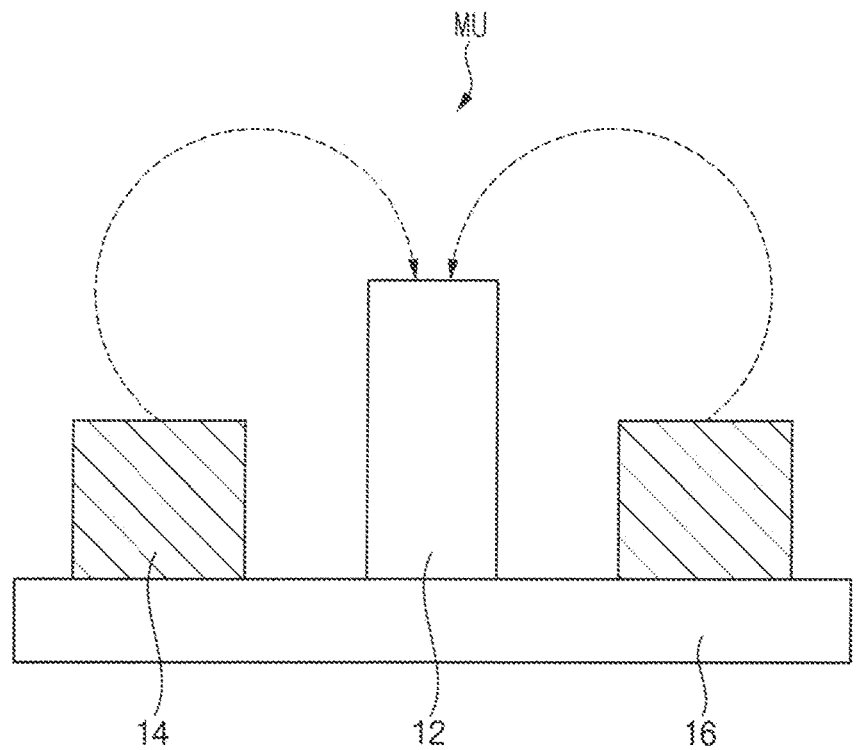
FIGS. 8, 9 and 10 are cross-sectional views illustrating a magnet unit of a magnet module according to embodiments.
Figure 9:
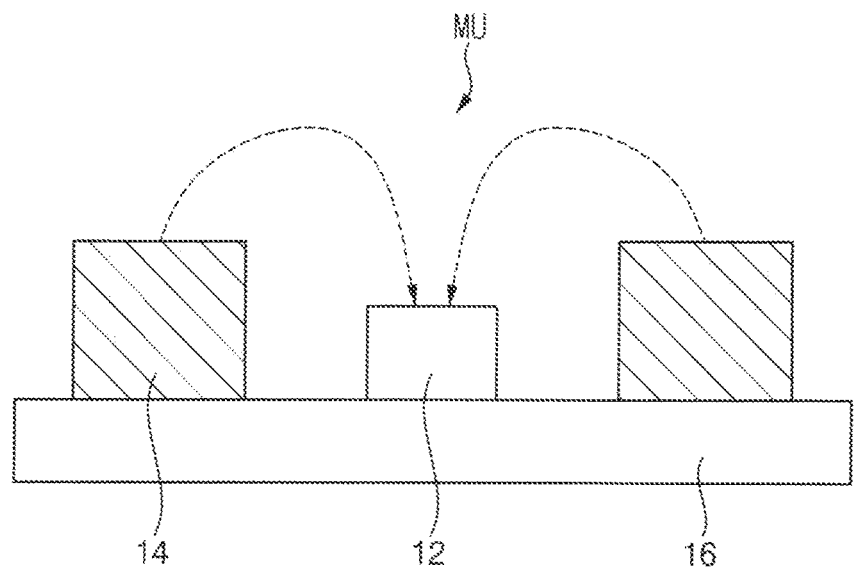
Figure 10:
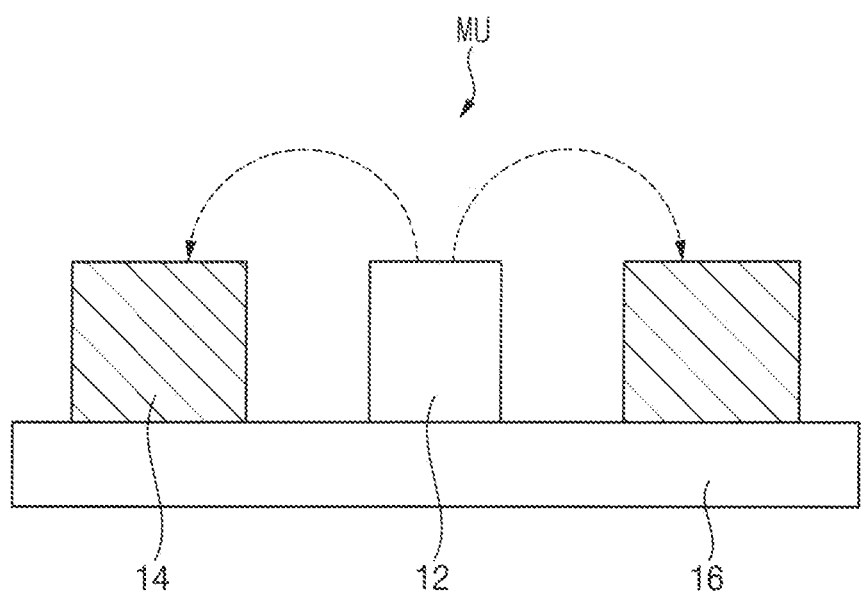

FIGS. 8, 9 and 10 are cross-sectional views illustrating a magnet unit of a magnet module according to embodiments.

Referring to FIG. 8, a magnet module includes a first magnet member 12 and a second magnet member 14. The second magnet member 14 may surround the first magnet member 12 in a plan view and may be spaced apart from the first magnet member 12.

In an embodiment, the first magnet member 12 may have a height greater than a height of the second magnet member 14.

Referring to FIG. 9, a first magnet member 12 may have a height less than a height of a second magnet member 14.

Referring to FIG. 10, a first magnet member 12 may have the same height as a second magnet member 14.

In the embodiment illustrated in FIG. 1, the first magnet member 12 may be an S-pole and the second magnet member 14 may be an N-pole. However, embodiments are not limited thereto.

For example, a first magnet member 12 may be an N-pole and a second magnet member 14 may be an S-pole.

As explained in the above, a first magnet member and a second magnet member may be variously adjusted or combined to change or control a shape of magnetic field.

Figure 11:
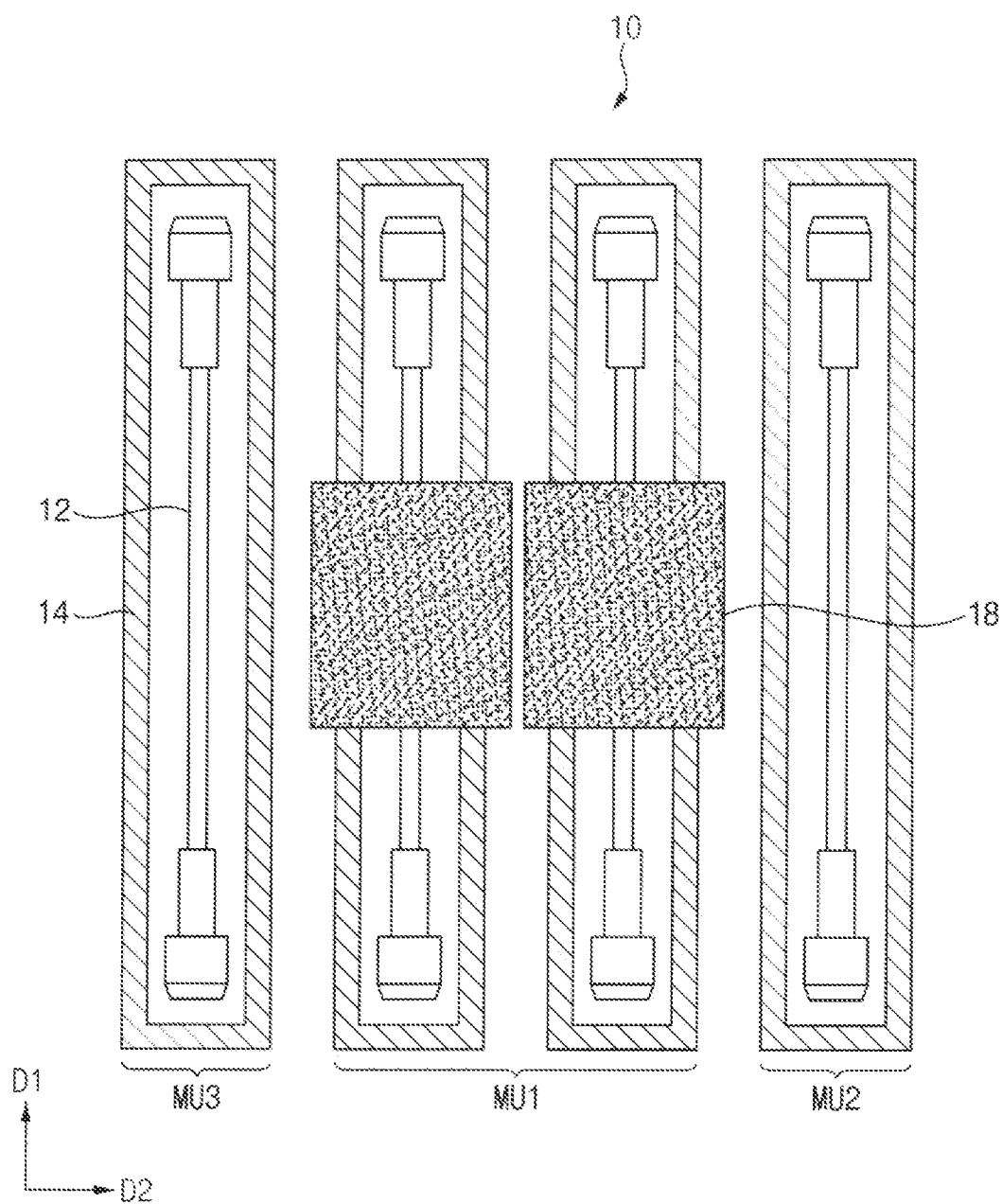
FIG. 11 is a plan view illustrating a magnet module according to an embodiment.
Figure 12:
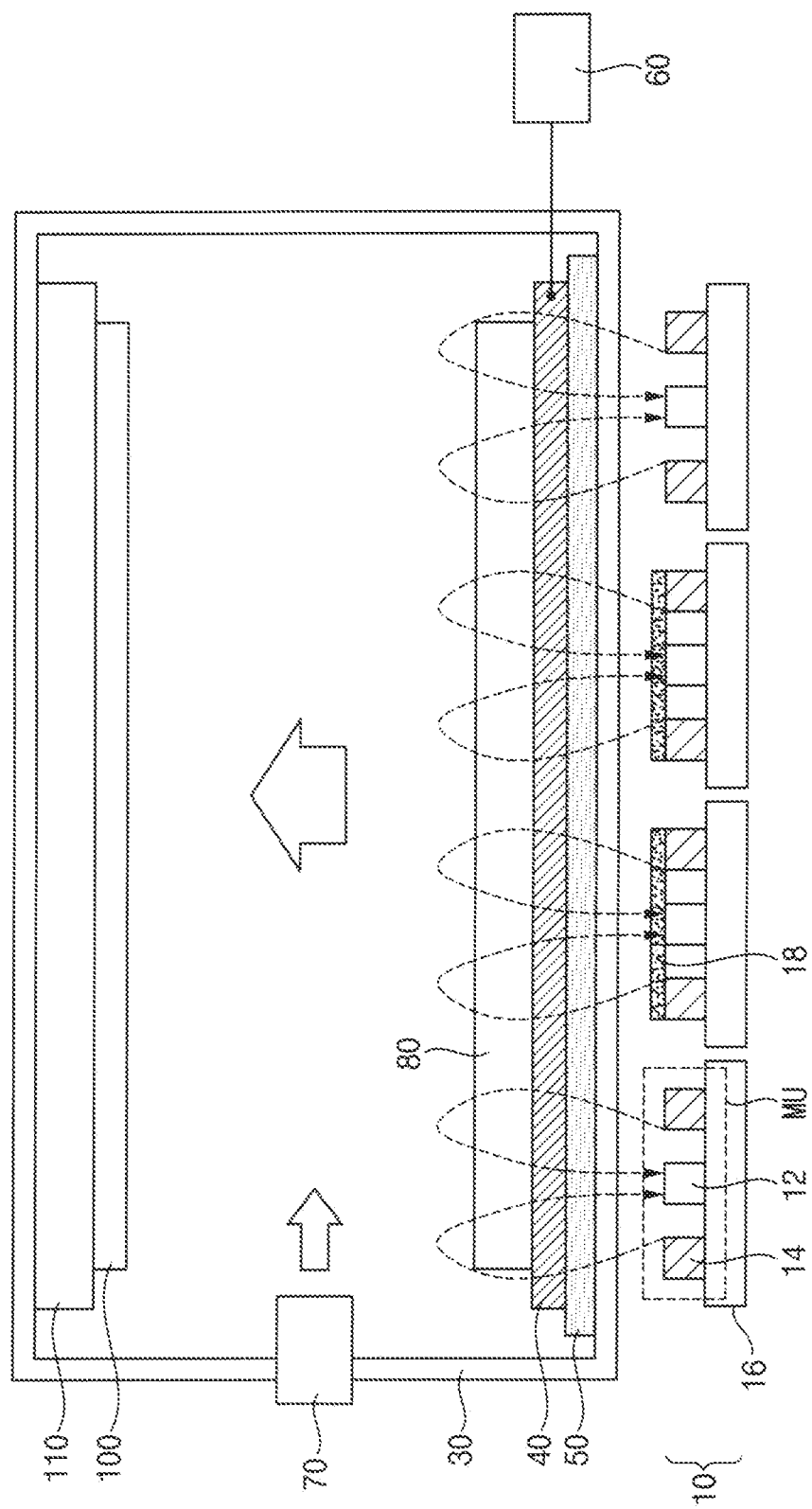
FIGS. 12 and 13 are schematic views illustrating a sputtering apparatus according to embodiments.
Figure 13:
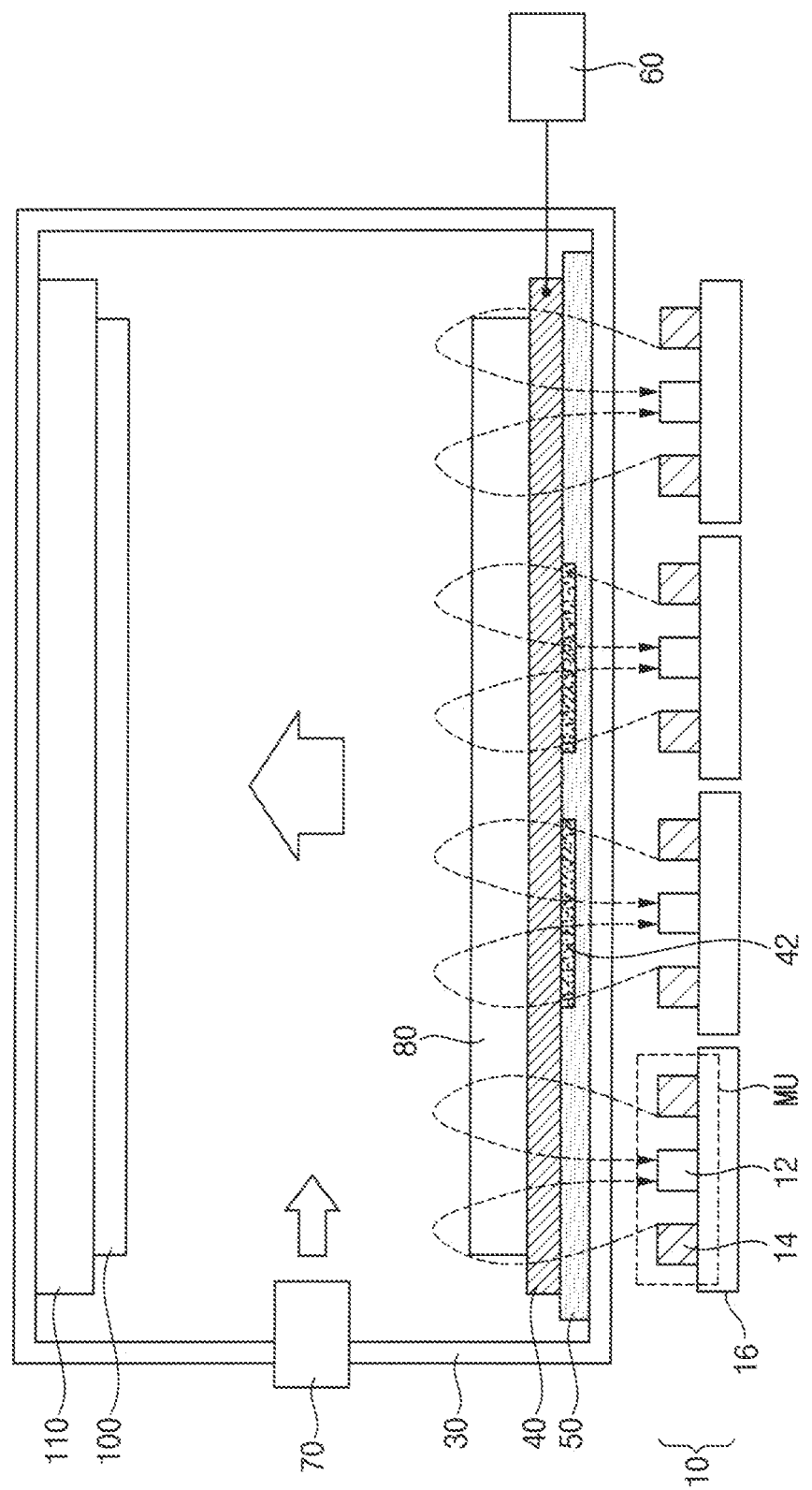

FIG. 11 is a plan view illustrating a magnet module according to an embodiment. FIGS. 12 and 13 are schematic views illustrating a sputtering apparatus according to embodiments.

Referring to FIGS. 11 and 12, a sputtering apparatus according to an embodiment includes a back plate 40 and a magnet module 10 disposed under the back plate 40. The back plate 40 may support a target 80 and may function as a cathode which receives a voltage to generate plasma.

The magnet module 10 includes a first magnet member 12 and a second magnet member 14. The first magnet member 12 may extend along a first direction D1. The second magnet member 14 may surround the first magnet member 12 in a plan view. The second magnet member 14 may completely surround the first magnet member 12 in a plan view. The first magnet member 12 and the second magnet member 14 may be fixed on a supporting plate 16.

A magnet unit MU may include a combination of one first magnet member 12 and one second magnet member 14. A plurality of magnet units may be arranged along a second direction D2 crossing the first direction D1 to form a magnet module 10.

In an embodiment, the magnet module 10 may further include a shielding member 18 that covers at least a portion of the magnet unit MU.

The shielding member 18 may reduce magnetic field in an area overlapping the shielding member 18. Thus, the shielding member 18 may be disposed in an area where magnetic field is relative strong so that uniformity of magnetic field may be increased entirely on the magnet module 10.

For example, as illustrated in FIG. 11, each shielding member 18 is disposed to cover a center portion of each first magnet unit MU1 disposed in an inner area of the magnet module 10. However, embodiments are not limited thereto. The shielding member 18 may be variously disposed according to practical distribution of magnetic field. One shielding member may cover center portions of first magnet units MU1 disposed in an inner area of the magnet module 10.

The shielding member 18 may include a material with a high permeability. For example, the shielding member 18 may include a stainless steel sheet, amorphous metal sheet, a permolloy sheet, a silicon steel plate, a steel plate or a combination thereof.

Referring to FIG. 13, a shielding member 42 may be disposed on a lower surface of a back plate 40. For example, the shielding member 42 may be disposed between the back plate 40 and a protective sheet 50.

As explained in the above, a magnet module may be combined with other components according to embodiments to improve uniformity of magnetic field. Furthermore, position of the magnet module may be changed to improve erosion uniformity of a target. A sputtering apparatus may further include a transporting apparatus to move the magnet module.

According to embodiments, uniformity of magnetic field in a sputtering apparatus may be improved. Thus, erosion uniformity of a target may be improved. Thus, quality of a thin film formed by sputtering may be improved, and a target may be used for a longer time.

Figure 14:
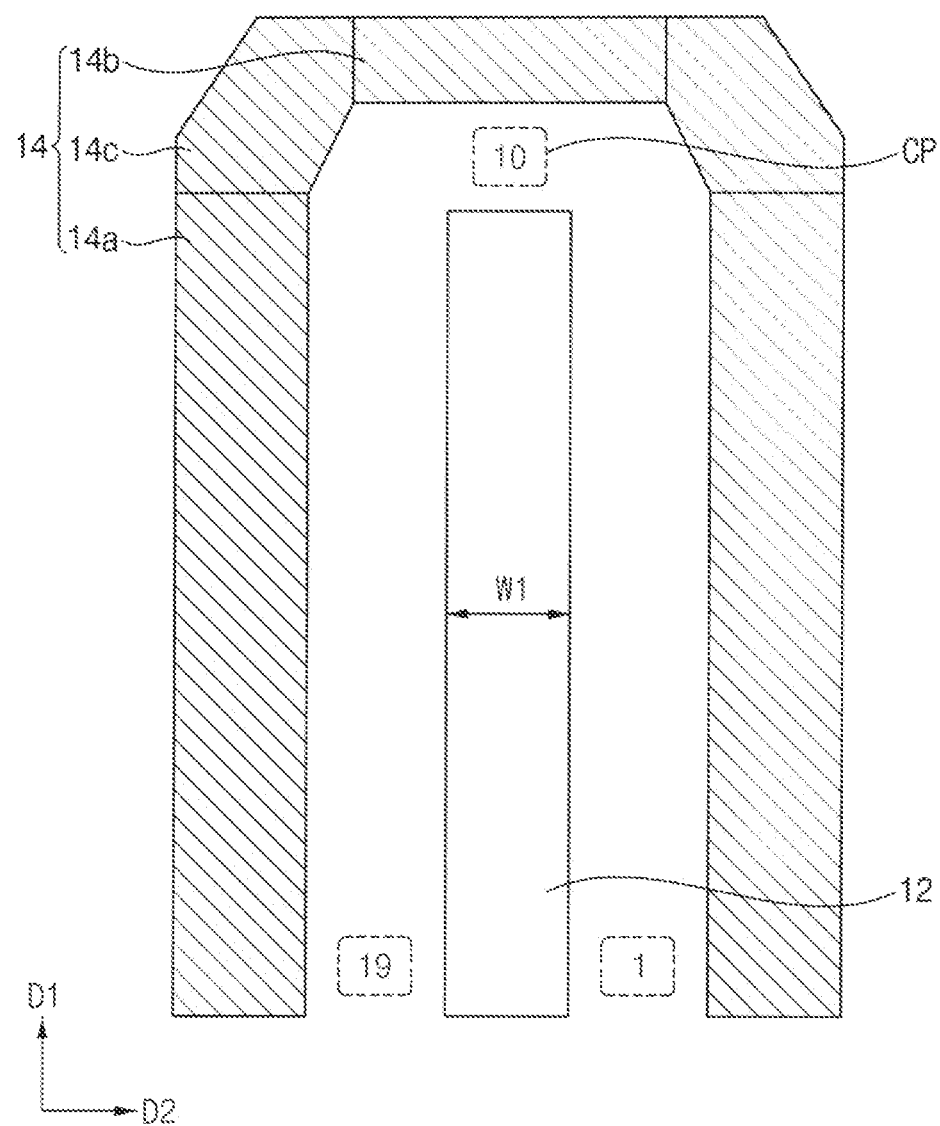
FIG. 14 is an enlarged plan view illustrating a magnet module according to a comparative example.

FIG. 14 is an enlarged plan view illustrating a magnet module according to a comparative example.

Referring to FIG. 14, a magnet module according to the comparative example includes a first magnet member 12 and a second magnet member 14. The first magnet member 12 extends along a first direction D1. The second magnet member 14 surround the first magnet member 12 in a plan view.

The first magnet member 12 has a same width along the first direction D1. A width of the first magnet member 12 is the same as a width of the middle portion (the first portion) of the first magnet member according to embodiments. The second magnet member 14 has a shape the same as the second magnet member according to embodiments.

Magnetic field from magnet modules according to the comparative example, Example 1 which has a shape illustrated in FIG. 3 and Example 2 which has a shape illustrated in FIG. 5, was measured. Particularly, magnetic field was measured on an area between the first magnet member 12 and the second magnet member 14 along positions directed by dot line boxes illustrated in FIG. 14.

Figure 15:
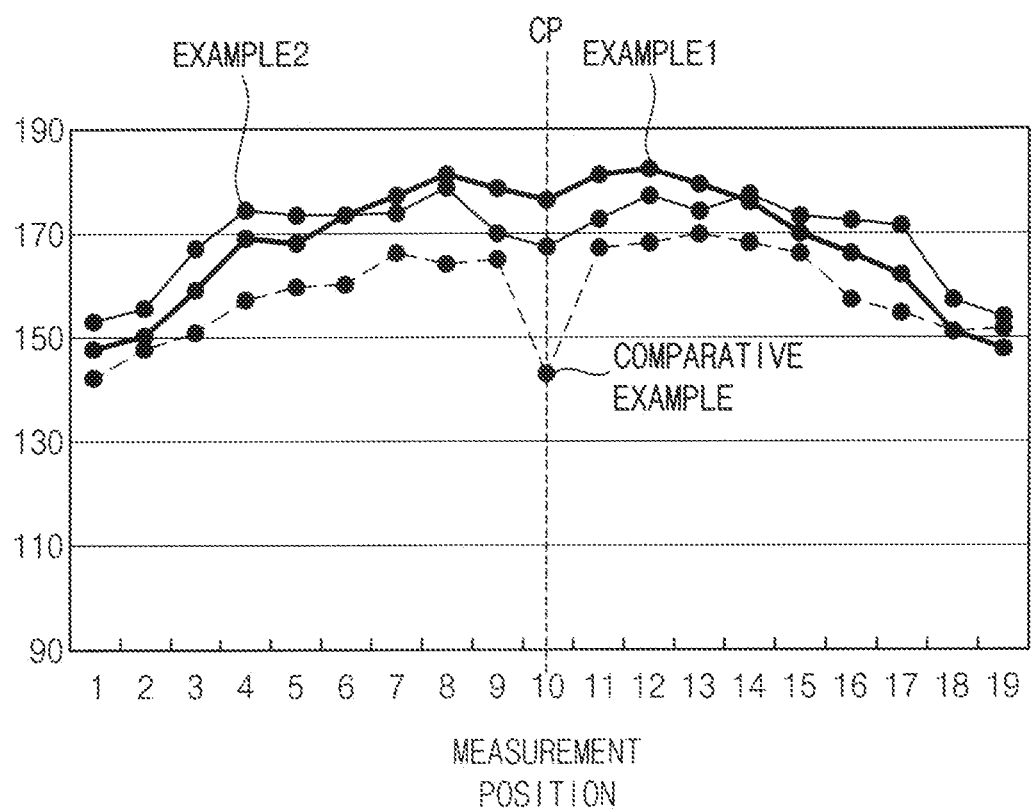
FIG. 15 is a graph showing intensity of measured magnetic field from magnetic modules according to the comparative example and embodiments.

FIG. 15 is a graph showing intensity of measured magnetic field from magnetic modules according to the comparative example and embodiments.

Referring to FIG. 15, it can be noted that sharp decrease of magnetic field in a distal area CP may be improved in the magnet modules according to Examples 1 and 2. Furthermore, it can be noted that uniformity of magnetic field may be further improved when a protrusion is removed between the third portion 12c having a tapered shape and the second portion 12b having a rectangular shape to form a seamless edge.

Embodiments may be used for a deposition apparatus and a deposition process. For example, embodiments may be used for forming various thin films to form a thin film transistor, a wiring, an active layer in the process of manufacturing a display device, a semiconductor device or the like.

The foregoing is illustrative of embodiments and is not to be construed as limiting thereof. Although embodiments have been described, those skilled in the art will readily appreciate that many modifications are possible in the embodiments without materially departing from the novel teachings and aspects of the present inventive concept. Accordingly, all such modifications are intended to be included within the scope of the present inventive concept. Therefore, it is to be understood that the foregoing is illustrative of various embodiments and is not to be construed as limited to the specific embodiments disclosed, and that modifications to the disclosed embodiments, as well as other embodiments, are intended to be included within the scope of the present inventive concept, as set forth in the following claims and equivalents thereof.

What is claimed is:

1. A magnet module comprising at least one magnet unit, the magnet unit including a first magnet member and a second magnet member surrounding the first magnet member in a plane view, the first magnet member extending along a first direction and including a middle portion and an end portion,
wherein the first magnet member includes a first portion which is disposed in the middle portion and extends along the first direction, and a second portion which is disposed in the end portion and has a width greater than a width of the first portion.

2. The magnet module of claim 1, wherein the second magnet member includes a first portion which extends along the first direction and is spaced apart from the first magnet member along a second direction crossing the first direction and a second portion which extends along the second direction and is spaced apart from the first magnet member along the first direction.

3. The magnet module of claim 2, wherein a width of the first magnet member increases gradually or step wise along the first direction toward an end of the first magnet member.

4. The magnet module of claim 3, wherein a width of the first magnet member increases in a portion where Y1 is equal to or greater than L1*0.5 and equal to or less than L1*1.2, where Y1 is a distance from the first magnet member to an outer boundary of the second magnet member along the first direction and L1 is a width of the magnet unit along the second direction.

5. The magnet module of claim 4, wherein a distance between the first magnet member and the second magnet member along the second direction is equal to or greater than L2*0.5 and equal to or less than G1*0.75 at a point where Y1=L1*0.5, where L2 is a width of the first portion of the second magnet member and G1 is a distance between the first portion of the first magnet member and the first portion of the second magnet member.

6. The magnet module of claim 5, wherein the first magnet member further includes a third portion that is disposed adjacent to the second portion and has a width decreasing toward the second portion of the second magnet member along the first direction.

7. The magnet module of claim 6, wherein the first magnet member further includes a fourth portion that is disposed between the first portion and the second portion and has a width less than a width of the second portion and greater than a width of the first portion.

8. The magnet module of claim 7, wherein, in the first magnet member, the width of the fourth portion is reduced gradually from the second portion toward the first portion.

9. The magnet module of claim 6, wherein the width of at least a portion of the third portion of the first magnet member is greater than the width of the second portion of the first magnet member.

10. The magnet module of claim 5, wherein the first magnet member further includes a third portion that is disposed closer to the second magnet member than the second portion is and has a uniform width greater than the width of the second portion of the first magnet member.

11. The magnet module of claim 5, wherein the second magnet member further includes a corner portion that connects the first portion and the second portion of the second magnet member to each other and has a boundary surface extending in an inclined direction crossing the first direction and the second direction.

12. The magnet module of claim 5, wherein a plurality of magnet units are arranged along the second direction,
wherein center lines of the first magnet member and the second magnet member which extend along the first direction coincide with each other in a magnet unit disposed in an inner area of the magnet module, and
wherein a virtual center line of the first magnet member disposed outmost portion of the magnet module does not overlap a virtual center line of the second magnet member disposed outmost portion of the magnet module.

13. A magnet module comprising at least one magnet unit, the magnet unit including a first magnet member and a second magnet member surrounding the first magnet member in a plane view, the first magnet member extending along a first direction and including a middle portion and an end portion,
wherein the first magnet member including a first portion which is disposed in the middle portion and extends along the first direction, a second portion which is disposed in the end portion and has a width greater than a width of the first portion, and a third portion that is disposed adjacent to the second portion and has a width decreasing toward the second magnet member along the first direction, and
wherein the second magnet member includes a first portion which extends along the first direction and is spaced apart from the first magnet member along a second direction crossing the first direction and a second portion which is spaced apart from the first magnet member along the first direction.

14. The magnet module of claim 13, wherein the first magnet member further includes a fourth portion that is disposed between the first portion and the second portion and has a width less than a width of the second portion and greater than a width of the first portion.

15. The magnet module of claim 14, wherein, in the first magnet member, the width of the fourth portion is reduced gradually from the second portion toward the first portion.

16. A sputtering apparatus comprising:
a back plate connected to a power supplier; and
a magnet module disposed under the back plate,
wherein the magnet module includes a first magnet member and a second magnet member surrounding the first magnet member in a plane view, the first magnet member extending along a first direction and including a middle portion and an end portion,
wherein the first magnet member includes a first portion which is disposed in the middle portion and extends along the first direction and a second portion which is disposed in the end portion and has a width greater than a width of the first portion, wherein the second magnet member includes a first portion which extends along the first direction and is spaced apart from the first magnet member along a second direction crossing the first direction and a second portion which extends along the second direction and is spaced apart from the first magnet member along the first direction, wherein a width of the first magnet member increases gradually or step wise along the first direction toward an end of the first magnet member, wherein a width of the first magnet member increases in a portion where Y1 is equal to or greater than L1*0.5 and equal to or less than L1*1.2, where Y1 is a distance from the first magnet member to an outer boundary of the second magnet member along the first direction and L1 is a width of the magnet unit along the second direction, and wherein a distance between the first magnet member and the second magnet member along the second direction is equal to or greater than L2*0.5 and equal to or less than G1*0.75 at a point where Y1=L1*0.5, where L2 is a width of the first portion of the second magnet member and G1 is a distance between the first portion of the first magnet member and the first portion of the second magnet member.

17. The sputtering apparatus of claim 16, wherein the first magnet member further includes a third portion that is disposed adjacent to the second portion and has a width decreasing toward the second portion of the second magnet member along the first direction.

18. The magnet module of claim 17, wherein the first magnet member further includes a fourth portion that is disposed between the first portion and the second portion and has a width less than a width of the second portion and greater than a width of the first portion.

19. The magnet module of claim 18, wherein, in the first magnet member, the width of the fourth portion is reduced gradually from the second portion toward the first portion.

20. The magnet module of claim 18, wherein the width of at least a portion of the third portion of the first magnet member is greater than the width of the second portion of the first magnet member.

* * * * *